United States Patent [19]
Sywyk

[11] Patent Number: 5,336,938
[45] Date of Patent: Aug. 9, 1994

[54] APPARATUS FOR GENERATING AN ASYNCHRONOUS STATUS FLAG WITH DEFINED MINIMUM PULSE

[75] Inventor: Stefan P. Sywyk, San Jose, Calif.

[73] Assignee: Cypress Semiconductor Corporation, San Jose, Calif.

[21] Appl. No.: 904,431

[22] Filed: Jun. 25, 1992

[51] Int. Cl.$^5$ .................. H03K 19/00; H03K 19/21
[52] U.S. Cl. ............................ 307/265; 307/234; 307/272.3; 328/111
[58] Field of Search .......... 307/265, 234, 272.3, 307/480; 328/111, 112

[56] References Cited

U.S. PATENT DOCUMENTS

| | | | |
|---|---|---|---|
| 4,833,651 | 5/1989 | Seltzer et al. | 365/189.07 |
| 5,150,313 | 9/1992 | van den Engh et al. | 364/569 |
| 5,198,709 | 3/1993 | O'Connell | 307/480 |
| 5,198,710 | 3/1993 | Houston | 307/234 |

Primary Examiner—Timothy P. Callahan
Attorney, Agent, or Firm—Blakely, Sokoloff, Taylor & Zafman

[57] ABSTRACT

An asynchronous flag generator for generating an asynchronous flag having a minimum defined active pulse length. The asynchronous flag generator comprises an arbitrary length flag generator for generating an arbitrary length status flag signal from at least two asynchronous signals, one being a set flag signal and the other being a clear flag signal. A minimum pulse generator for generating a minimum pulse having a predefined pulse length upon initiation of the set flag signal. Combinational logic combines the arbitrary length status flag with the minimum pulse to generate an asynchronous status flag with a defined minimum active pulse length.

13 Claims, 8 Drawing Sheets

APPARATUS FOR GENERATING AN ASYNCHRONOUS STATUS FLAG WITH DEFINED MINIMUM PULSE

BACKGROUND OF THE INVENTION

1. Field of the Invention

The invention relates to the field of semiconductor integrated circuits, and more specifically, to an apparatus for generating an asynchronous status flag which has a defined minimum pulse width.

2. Prior Art

Flags are provided in a number of integrated circuits. Flags signal the present condition of a circuit. For example, in a microprocessor flags are used to signal when errors occur, or when the microprocessor is busy. In FIFO (first in, first out) memory devices an "EMPTY flag" is used to signal when the device is empty or not empty. A "FULL flag" is used to signal when the device is full of data or not full of data.

Figure 1:
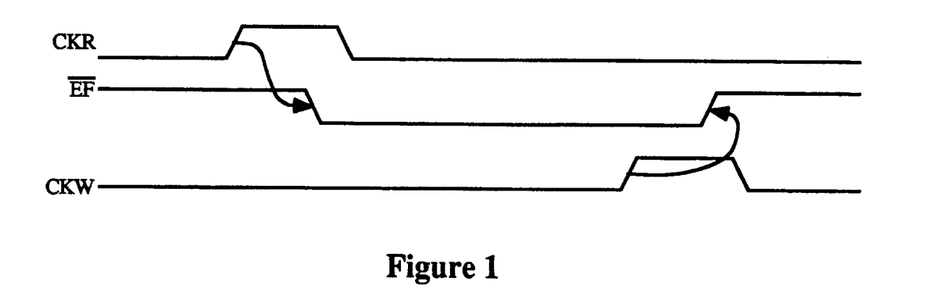
FIG. 1 is a timing diagram illustrating the generation of an asynchronous status flag from two asynchronous signals.

In a FIFO, an empty flag ($\overline{EF}$), for example, is derived from two asynchronous signals, a clock read signal (CKR) and the clock write signal (CKW). As shown in FIG. 1, assume that a FIFO presently contains one word, a read signal (CKR) would read out the only word contained in the FIFO and cause the FIFO to go empty. The rising edge of the read clock signal (CKR) causes the empty flag ($\overline{EF}$) to go low to signal a true empty condition ($\overline{EF}$ is an active low signal). The empty flag ($\overline{EF}$) signal remains low (true) until new data is written into the FIFO. When a write clock signal (CKW) is generated to write new data into memory, the $\overline{EF}$ signal goes high indicating that the FIFO is no longer empty.

The $\overline{EF}$ status flag is referred to as an "asynchronous flag" because it is derived from two independent signals. That is, CKR and CKW are asynchronous signals, they have no predetermined or fixed time relationship to one another. (The CKR signal is generated by a system component which reads data out of the FIFO at one rate, while the CKW signal is generated by a different component which writes data into the FIFO at a second independent rate.) The CKR signal causes the falling edge of the $\overline{EF}$ signal and the CKW signal causes the rising edge of the $\overline{EF}$ signal. The active pulse length of the $\overline{EF}$ signal is defined by the time lapse between the CKR signal and the CKW signal.

Figure 2:
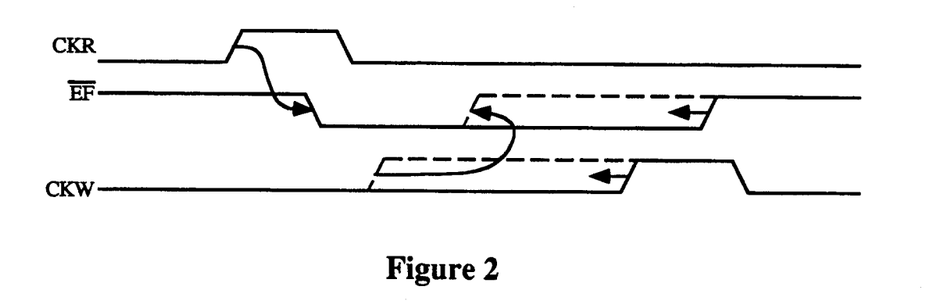
FIG. 2 is a timing diagram illustrating the generation of an asynchronous status flag from two asynchronous signals as their timing relationship changes.
Figure 3:
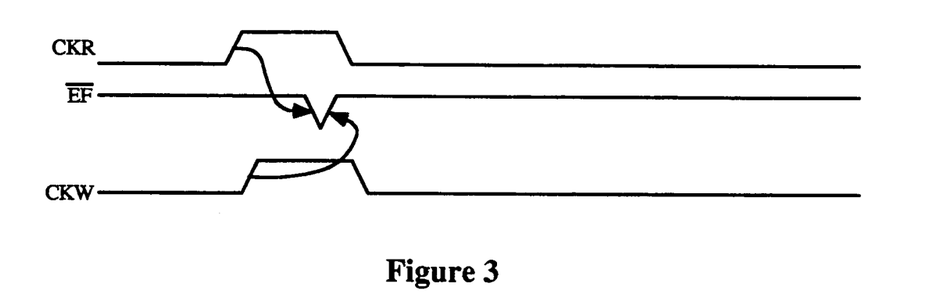
FIG. 3 is a timing diagram illustrating the formation of an asynchronous status flag with a "miniscule" pulse length due to the short delay between the two generating asynchronous signals.

As shown in FIG. 2, as the time lapse between the CKR signal and the CKW signal is decreased so is the active pulse length of the $\overline{EF}$ signal. If the time delay between the CKR signal and the CKW signal is decreased even further, as shown in FIG. 3, the active pulse length of the $\overline{EF}$ signal can become "miniscule". Such a small pulse length can cause several problems for sequential logic circuits located downstream of the asynchronous status flag generator. (Downstream circuits are circuits which use the asynchronous signal, i.e. the consumer of the signal.) For example, in some cases the $\overline{EF}$ signal is used as data in downstream circuits. Such "miniscule" pulse lengths can violate data set-up and hold times. In other cases, the $\overline{EF}$ signal is used as a clock to drive downstream circuits. Here, the small signals can violate minimum clock pulse length requirements for the circuits. Such "miniscule" pulses can cause downstream sequential logic circuits to go into metastable conditions.

Metastable conditions are highly undesirable and can cause severe reliability problems in circuits. Presently, a substantial amount of additional circuitry and expense must be added to a circuit which receives asynchronous flags in order to protect against such small pulses. That is, additional circuitry and engineering must be provided to protect circuits imputing asynchronous flags from "miniscule" pulses which can cause the circuits to go into metastable conditions.

Thus, what is needed is an apparatus which generates an asynchronous status flag without generating "miniscule" pulses and their undesirable effects.

SUMMARY OF THE INVENTION

An apparatus for generating an asynchronous status flag wherein the generated status flag has a minimum defined pulse length is described. The asynchronous status flag generator of the present invention has a first input for providing a first signal wherein the first signal "sets" the status flag. A second input for providing a second signal which "clears" the status flag. The second signal is asynchronous with respect to the first signal. Sequential logic means is coupled to the first and the second inputs wherein the sequential logic means generates an arbitrary length status flag which has an active pulse defined by the time difference between the first signal which sets the flag and the second signal which clears the flag. A minimum pulse generating means is coupled to the first input and generates a minimum pulse having a predefined length upon initiation of the first signal which sets the flag. The minimum pulse generating means comprises an inverting delay coupled to the first input and a nor gate coupled to the output of the inverting delay and to the first input. The inverting delay comprises a plurality of inverters and a plurality of delay elements. Combinational logic means is coupled to receive the arbitrary length status flag and the minimum pulse and generates the asynchronous status flag having: i) an active pulse length equal to the active pulse length of the minimum pulse when the active pulse length of the minimum pulse is longer than the active pulse length of the arbitrary length status flag, and ii) an active pulse length equal to the active pulse length of the arbitrary length status flag when the arbitrary length status flag has an active pulse length longer than the active pulse length of the minimum pulse.

A goal of the present invention is to provide an asynchronous status flag which does not cause metastable conditions.

Another goal of the present invention is to provide an asynchronous status flag which has a minimum active pulse length.

Yet another goal of the present invention is to eliminate reliability problems associated with miniscule pulses generated by asynchronous status flags.

Still yet another goal of the present invention is to eliminate the need to provide additional circuitry to sequential logic circuits downstream of asynchronous status flag generators in order to filter out potential miniscule pulses generated by asynchronous status flags.

Still yet another goal of the present invention is to provide an asynchronous status flag generator which can be used to generate a wide variety of asynchronous status flags.

DETAILED DESCRIPTION OF THE PRESENT INVENTION

The present invention describes an apparatus for generating an asynchronous status flag with a defined minimum pulse length. In the following description numerous specific details are set forth such as specific status flags and specific sequential logic circuits etc. in order to provide a more thorough understanding of the present invention. It will be obvious, however, to one skilled in the art that the present invention may be practiced without these specific details. In other instances, well known circuit design principles have not been described in detail in order to not unnecessarily obscure the present invention.

The present invention is an apparatus for generating an asynchronous status flag. The apparatus generates a status flag from at least two independent, asynchronous signals. One signal "sets" or "activates" the status flag, while the other signal "clears" or "deactivates" the status flag. The status flag is characterized by the fact that the flag's active pulse length has a fixed minimum length even if the "clear" signal follows directly after the "set" signal. That is, the active pulse length of the status flag is defined by the delay between the two signals, until a prespecified minimum delay is reached between the two signals, at which time the active pulse length of the status flag is defined by a predetermined minimum pulse length, and not a "miniscule" pulse length defined by the delay between the signals. In this way sequential logic circuits downstream of the asynchronous flag generator which utilize the asynchronous flag as data or as a clock will not be placed into metastable conditions.

Figure 4:
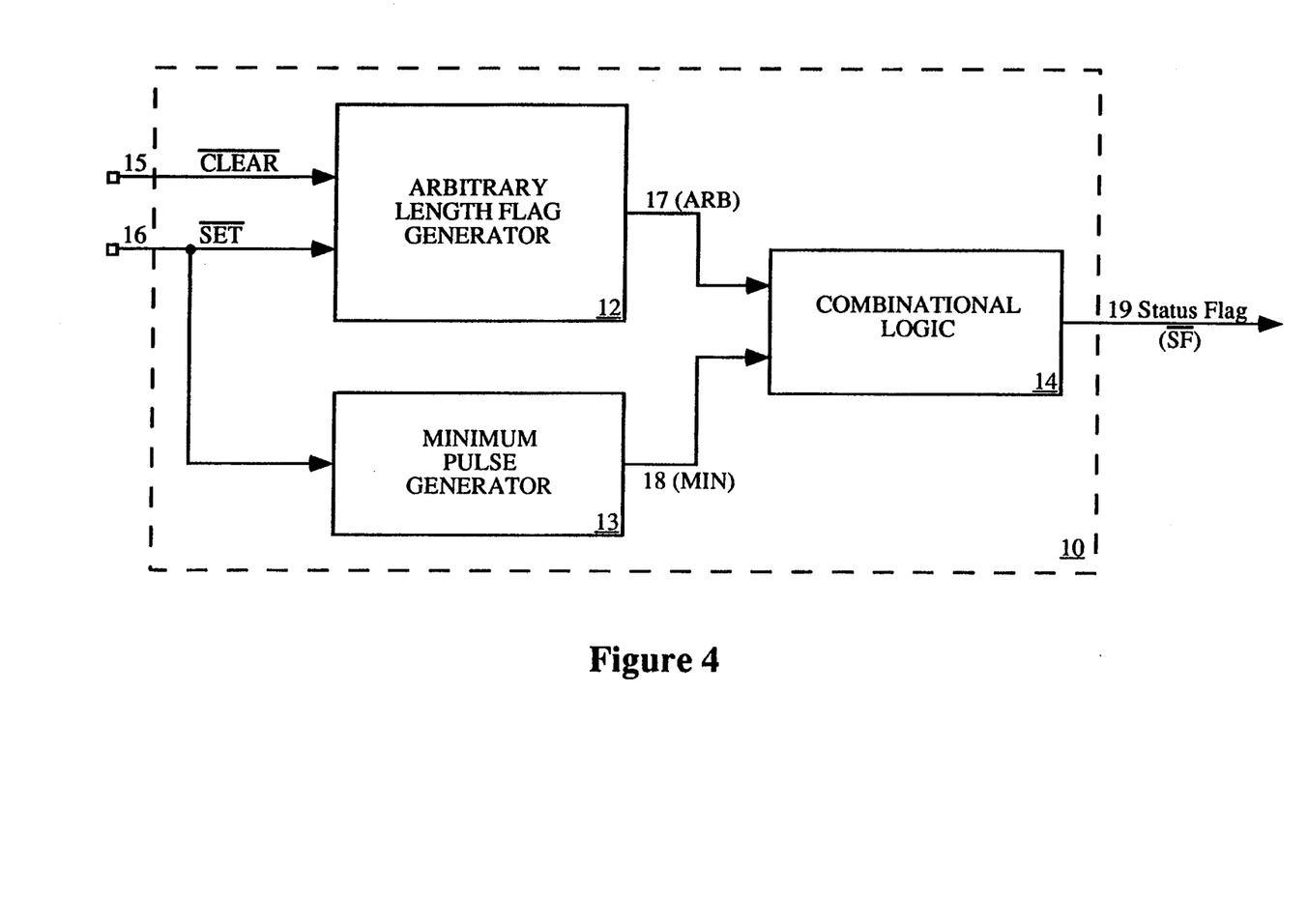
FIG. 4 is a block diagram illustrating the asynchronous status flag generator of the present invention.

As shown in FIG. 4, the asynchronous status flag generator 10 of the present invention can be broken up into three sub-units. An arbitrary length flag generator 12 for generating an arbitrary length status flag signal (ARB) which can be infinitely long or infinitesimally small. A minimum pulse generator 13 generates a MIN signal which has a predefined active pulse length, $T_{min}$, upon initiation of the set flag signal. Combinational logic 14 combines the two signals and outputs a status flag which can have an arbitrarily long active pulse length, but which never has an active pulse length which is shorter than the predefined active pulse length, $T_{min}$, of the MIN signal generated by the minimum pulse generator.

The arbitrary length flag generator 12 generates an arbitrary length status flag (ARB) which is "high" as long as the flagged condition remains true. The arbitrary length flag generator 12 generates the ARB signal from a $\overline{SET}$ (active low) signal and a $\overline{CLEAR}$ (active low) signal. The $\overline{SET}$ signal goes from "high" to "low" whenever the flagged condition becomes true. The $\overline{CLEAR}$ signal goes from "high" to "low" whenever the flagged condition becomes not true. The $\overline{CLEAR}$ and $\overline{SET}$ signals are asynchronous with respect to one another. The $\overline{CLEAR}$ and $\overline{SET}$ signals are normally derived from signals which originate from independent components.

The length of the active pulse of the ARB signal is defined by the amount of delay occuring between the high/low transition of the signal and a subsequent high/low transition of the $\overline{CLEAR}$ signal. The active pulse length of the ARB signal can be infinitely long or infinitesimally small. The arbitrary length flag generator 12 can generate "miniscule" pulses if the $\overline{CLEAR}$ signal is followed directly by the $\overline{SET}$ signal. If a $\overline{SET}$ high/low transition occurs while $\overline{CLEAR}$ is low the ARB signal remains low.

Once the ARB signal goes high to indicate that the flagged condition is true it remains high until a subsequent low $\overline{CLEAR}$ signal is provided to the arbitrary length flag generator 12. Likewise, once the ARB signal is low it remains low until a subsequent low $\overline{SET}$ signal is provided to the arbitrary length flag generator 12. The active pulse length of the arbitrary status flag signal (ARB) is considered "arbitrary" because it is defined by two signals which have no predetermined time relationship to one another. The active pulse length of the ARB signal can be infinitely long or infinitesimally small. Sequential logic is used in the arbitrary length flag generator 12 so that the ARB signal may be maintained after the triggering inputs are removed.

Figure 5:
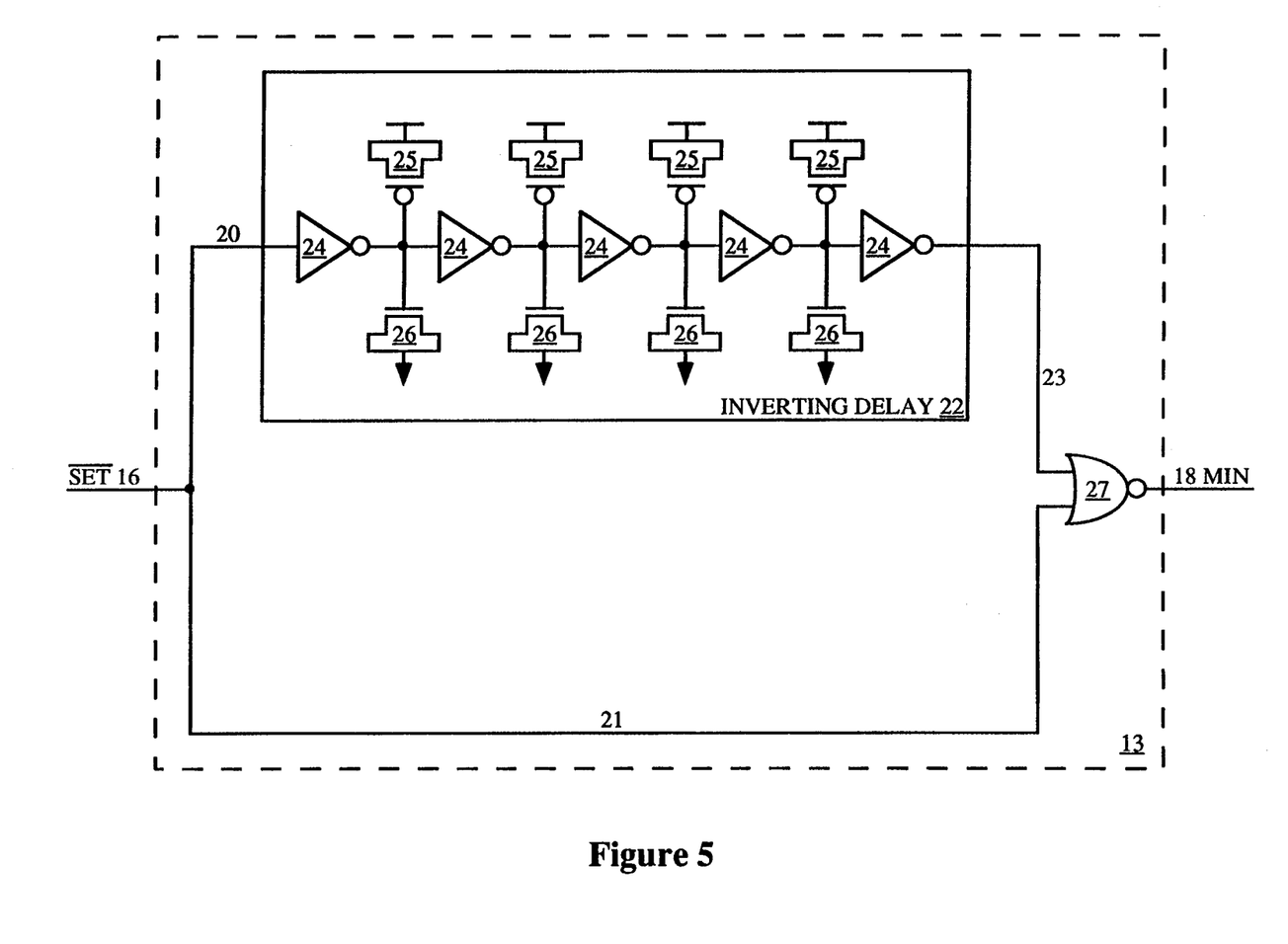
FIG. 5 is an illustration of a minimum pulse generator.

The minimum pulse generator 13 generates a minimum pulse signal (MIN) having a predefined active pulse length, $T_{min}$. When the $\overline{SET}$ signal goes from "high" to "low" the minimum pulse generator 13 generates the MIN signal. The MIN signal can be generated by circuitry such as a "one-shot" as shown in FIG. 5. The minimum pulse generator 13 includes an inverting delay 22 coupled in parallel with the $\overline{SET}$ signal on line 21. The two signals are "nored" together by a nor gate 27. When the $\overline{SET}$ signal goes from a high to low indicating a true flagged condition, the output 18 of the minimum pulse generator almost simultaneously goes from a "low" state to a "high" state. This is because at this time the nor gate 27 has low inputs on both nodes 21 and 23. At the same time, the low $\overline{SET}$ flag signal propagates on line 20 through a plurality of inverters 24 (an odd number of inverters) and delay capacitors 25 and 26. After time $T_{min}$ an inverted $\overline{SET}$ signal, high, reaches node 23. After time $T_{min}$ the nor gate 27 has a low input at node 21 and a high input at node 23 causing the nor gate to output a low signal. Thus, after time $T_{min}$ from the high/low transition of the $\overline{SET}$ signal, the MIN signal on node 18 is automatically pulled low by nor gate 27. Node 18 goes high from initiation of the $\overline{\text{SET}}$ flag signal, but is automatically pulled low after time $T_{min}$ from the time output 18 went high. In this way, the minimum pulse generator 13 always generates a MIN signal having a predefined pulse length, $T_{min}$, upon transition of the $\overline{\text{SET}}$ signal from high to low. The length of the active pulse, $T_{min}$, of the minimum pulse signal (MIN) is determined by the number of inverters 24 and the sizes and number of the delay capacitors 25 and 26 in inverting delay 22.

The combinational logic 14 receives as its inputs the arbitrary length status flag signal (ARB) on line 17 from the arbitrary length flag generator 12 and the minimum pulse (MIN) on line 18 from the minimum pulse generator 13. The combinational logic outputs a status flag signal ($\overline{\text{SF}}$, active low) which has an active pulse length at least as long as the active pulse length $T_{min}$ of the minimum pulse signal (MIN) and as long as the active pulse length of the arbitrary length status flag signal (ARB) when the active pulse length of the ARB signal is longer than the active pulse length, $T_{min}$, of the minimum pulse signal (MIN). The combinational logic 14 may simply be a "nor gate" or more complicated logic depending upon the specific application.

Figure 6A:
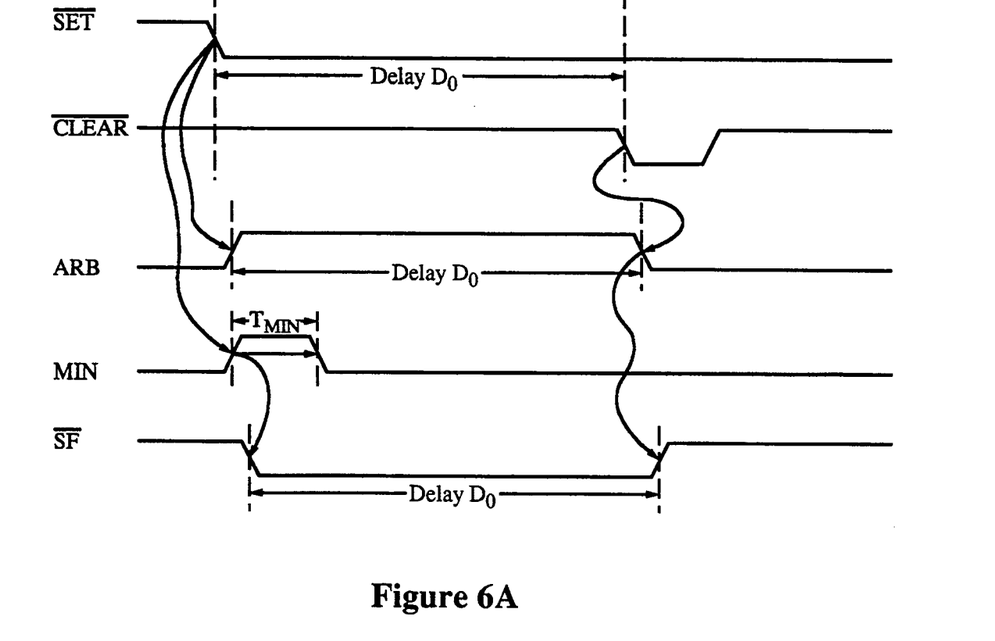
FIGS. 6A-6C are timing diagrams illustrating intermediate signals and flags of the present invention generated by different timing relationships between the inputs to the present invention.
Figure 6B:
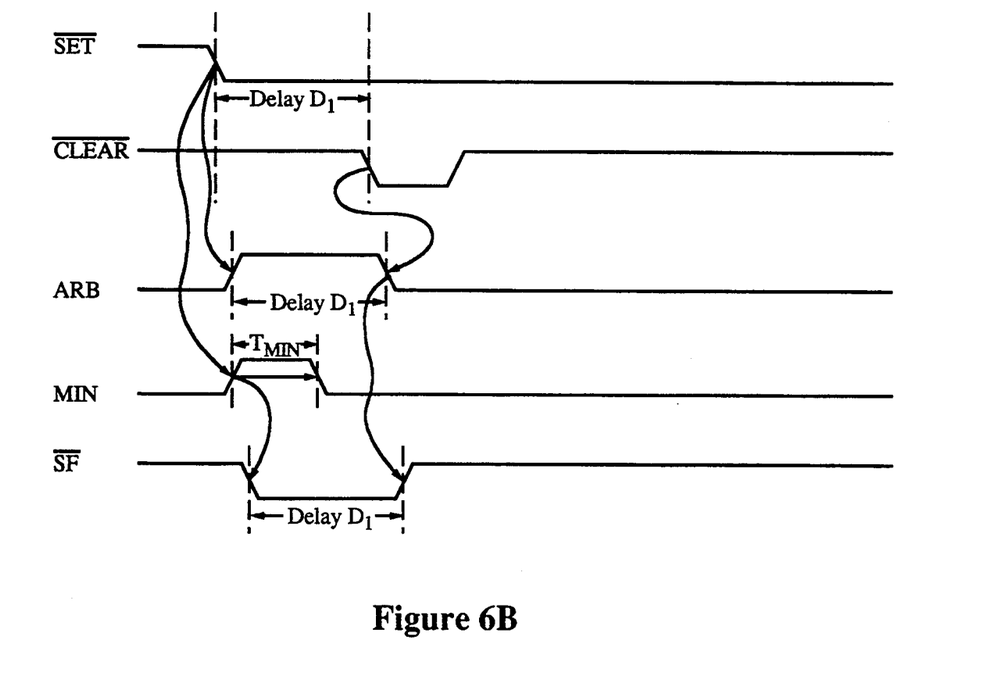
Figure 6C:
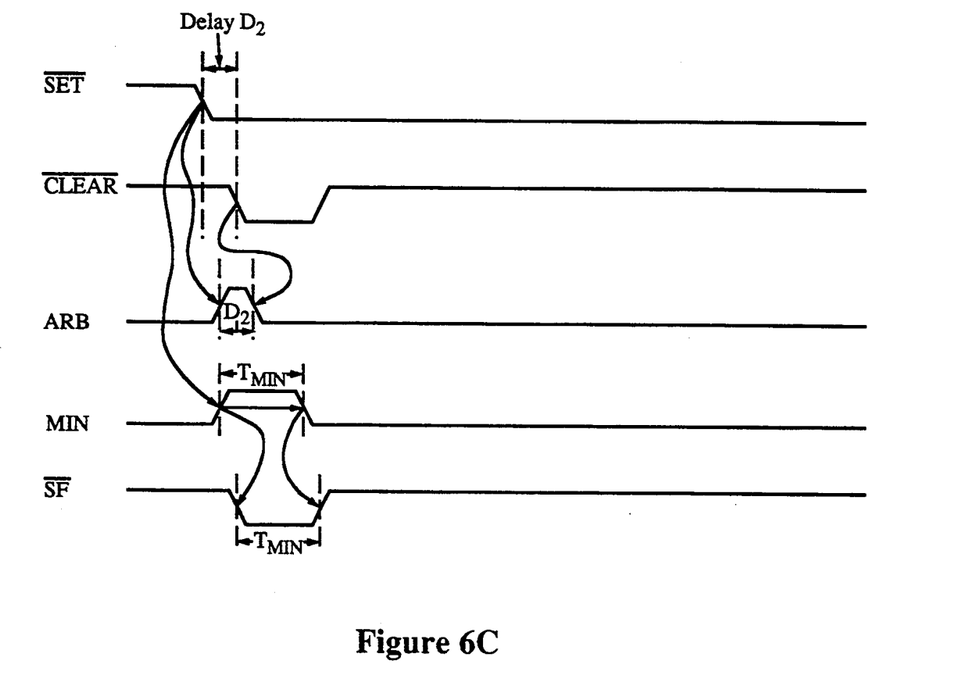

FIGS. 6A through 6C detail the generated signals of the present invention for a variety of different input timing relationships. In reference to FIG. 6A, the falling edge of a $\overline{\text{SET}}$ signal causes the sequential logic of the arbitrary length flag generator 12 to generate a high state (true) for the arbitrary length status flag (ARB) on line 17. At the same time the falling edge of the $\overline{\text{SET}}$ signal provided to the minimum pulse generator 13 initiates the generation of the active pulse of the minimum pulse (MIN) on line 18. The arbitrary length flag generator 12 maintains an active high ARB signal until a subsequent falling edge of a $\overline{\text{CLEAR}}$ signal is provided to the arbitrary flag generator 12 (i.e. the arbitrary length flag generator 12 maintains a high signal as long as the flagged condition remains true). The active pulse of the ARB signal is defined exclusively by the amount of delay (D0) occuring between the falling edge of the $\overline{\text{SET}}$ signal and the falling edge of a subsequent $\overline{\text{CLEAR}}$ signal.

The minimum pulse (MIN) on signal line 18 automatically goes low a predetermined time ($T_{min}$ defined by the inverting delay 22) after it went high due to the falling edge of the $\overline{\text{SET}}$ signal. In essence, the falling edge of the minimum pulse (MIN) is dependant upon and is defined by the rising edge of the minimum pulse. The minimum pulse signal (MIN) and the arbitrary length status flag signal (ARB) are combined together by the combinational logic 14 to generate the status flag ($\overline{\text{SF}}$, active low) of the present invention.

The falling edge of the status flag ($\overline{\text{SF}}$) is generated by the rising edge of the MIN signal. In FIG. 6A the rising edge of the status flag ($\overline{\text{SF}}$), however, is generated by the falling edge of the ARB signal because in this case the active pulse length, $D_0$, of the ARB signal is longer then the active pulse length, $T_{min}$, of the MIN signal (i.e. $D_0 > T_{min}$). In this way, the asynchronous status flag ($\overline{\text{SF}}$) has an active pulse length $D_0$ equal to the delay between the falling edge of the $\overline{\text{SET}}$ flag signal and the falling edge of the $\overline{\text{CLEAR}}$ flag signal.

In reference to FIG. 6B, the $\overline{\text{CLEAR}}$ signal in this example follows after a shorter delay $D_1$ from the initiation of the $\overline{\text{SET}}$ signal. In this example, the arbitrary length flag generator 12 generates an arbitrary length status flag signal (ARB) which has an active pulse length of $D_1$. The minimum pulse generator 13 also faithfully generates its minimum pulse signal (MIN) having the predefined active pulse length of $T_{min}$. Since the active pulse length $T_{min}$ of the minimum pulse (MIN) is smaller than the active pulse length of the ARB signal, $D_1$ (i.e. $D_1 > T_{min}$) the combinational logic 14 generates a status flag having an active pulse length equal to the active pulse length $D_1$ of the ARB signal generated by the arbitrary flag generator 12. That is, the rising edge of the status flag ($\overline{\text{SF}}$) is generated in the present case by the falling edge of the arbitrary length status flag (ARB).

In reference to FIG. 6C, a low $\overline{\text{CLEAR}}$ signal is provided shortly, time $D_2$, after the low $\overline{\text{SET}}$ flag signal. The arbitrary length flag generator 12 generates an arbitrary length status flag (ARB) defined by the delay $D_2$ between the $\overline{\text{SET}}$ and $\overline{\text{CLEAR}}$ signals. Since delay $D_2$ is so short, the sequential logic of the arbitrary length flag generator 12 generates an arbitrary length flag (ARB) having a "miniscule" active pulse length equal to $D_2$. The minimum pulse generator, as usual, faithfully generates a minimum pulse signal (MIN) having a predetermined pulse length, $T_{min}$, on initiation of the falling edge of the $\overline{\text{SET}}$ flag signal. In the present case, however, the falling edge of the minimum pulse (MIN) occurs later in time than the falling edge of the arbitrary length flag (ARB) (i.e., $T_{min} > D_2$). The combinational logic, therefore, outputs a $\overline{\text{SF}}$ signal having a falling edge defined by the rising edge of the MIN signal, and a rising edge defined by the falling edge of the MIN signal. In this way, the status flag ($\overline{\text{SF}}$) has an active pulse length equal to that of the pulse length, $T_{min}$, of the minimum pulse signal (MIN). The status flag ($\overline{\text{SF}}$), therefore, does not have a "miniscule" pulse length like the arbitrary length status flag (ARB). The status flag ($\overline{\text{SF}}$) provided on line 19 may be used as data or as a clock in downstream sequential logic circuits without worrying about causing metastable states in these circuits.

The present invention may be used to generate a wide variety of asynchronous flags. Additionally, the present invention can be used to drive circuitry, external or internal, to the chip containing the asynchronous flag generator 10 of the present invention. That is, the asynchronous flag generator 10 can be utilized to drive circuitry contained on the same chip as the flag generator 10. The asynchronous flag generator 10 may also be used to drive an I/O signal pin which drives circuitry discrete from the chip.

Figure 7:
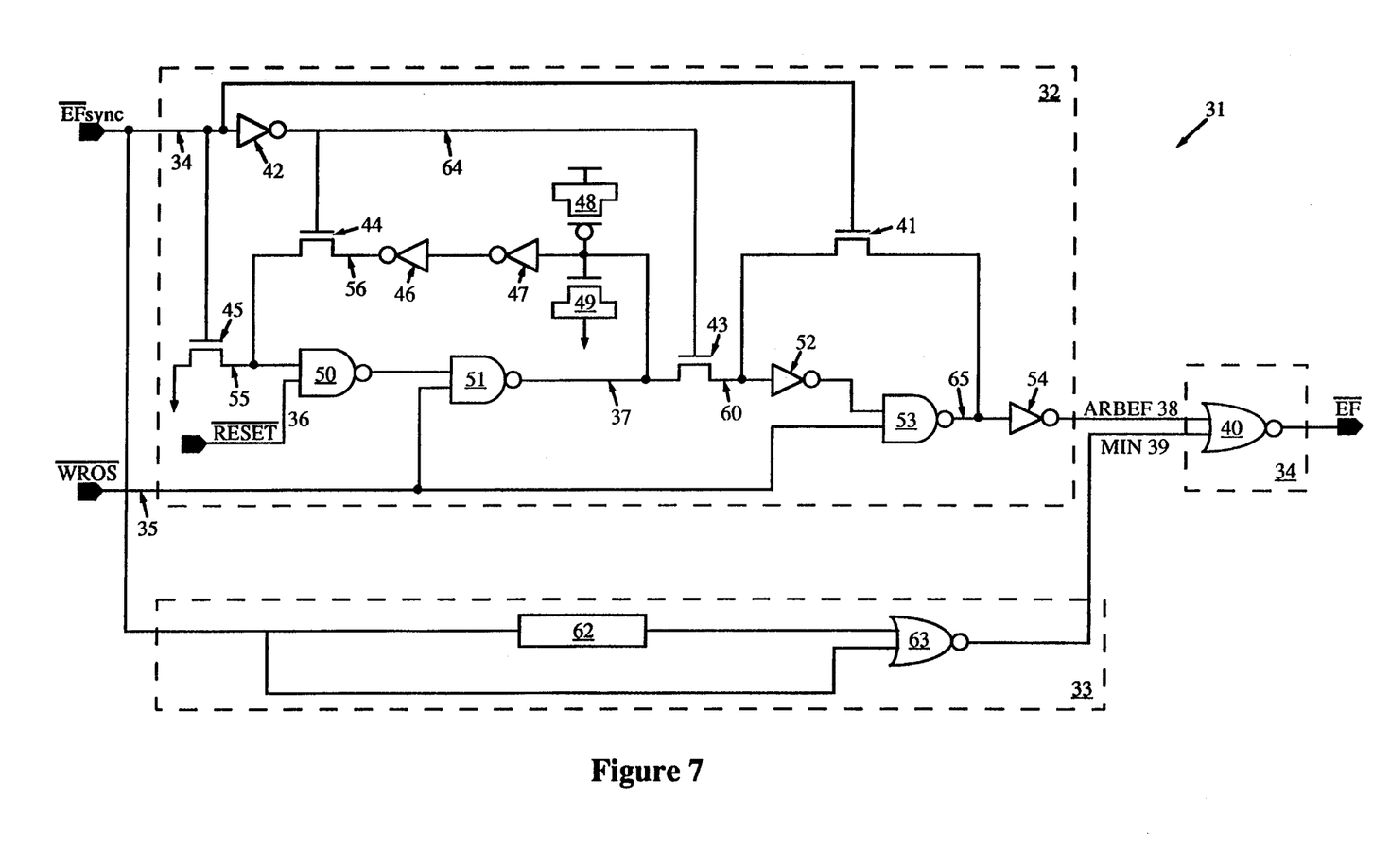
FIG. 7 is an illustration of an asynchronous Empty Flag $\overline{EF}$ generator for a FIFO.

A specific implementation of the present invention is shown in FIG. 7. FIG. 7 details an asynchronous flag generator for generating an "EMPTY flag" ($\overline{\text{EF}}$) for a FIFO. The empty flag $\overline{\text{EF}}$ is an active low signal. That is, the $\overline{\text{EF}}$ signal is low when the FIFO is empty, and the $\overline{\text{EF}}$ signal is high when the FIFO is not empty. The empty flag signal $\overline{\text{EF}}$ is an asynchronous flag because it is generated by two asynchronous signals, an $\overline{\text{EFsync}}$ signal (active low), which is essentially a $\overline{\text{SET}}$flag signal, and a $\overline{\text{WROS}}$ signal (active low) which is essentially a $\overline{\text{CLEAR}}$ flag signal.

The $\overline{\text{EFsync}}$ signal is derived from a read clock (CKR) provided to the FIFO by a system component that reads data out of the FIFO. The times at which the read signal is provided to the FIFO is completely unknown to the FIFO. The $\overline{\text{EFsync}}$ signal is a derivative of the read clock (CKR) and not the read clock itself. This is because not every read from the FIFO empties the FIFO. Only a read of the last word in the FIFO will empty the FIFO and cause the empty flag $\overline{\text{EF}}$ to be activated. Thus a special signal is generated by logic to indicate when the read, which empties the FIFO, occurs. The $\overline{EF}$sync goes low when the last word in the FIFO is read. The $\overline{EF}$sync signal goes high after a subsequent write signal is generated and the empty flag signal ($\overline{EF}$) goes high. Additionally, the $\overline{WROS}$ input is derived from the write clock signal (CKW). It is a one-shot of the CKW signal, and is generated every time a write is made into the FIFO, whether or not it is the first write. In general, however, it is only necessary to generate a $\overline{WROS}$ signal for the write which is to deactivate the flag.

The asynchronous EMPTY flag generator 31 of FIG. 7 comprises an arbitrary length empty flag generator 32, a minimum pulse generator 33, and a combinational logic 34. The arbitrary length empty flag generator 32 comprises sequential logic and generates an arbitrary length empty flag signal (ARBEF, active high) whose active pulse length is always defined by the delay occurring between the falling edge of the $\overline{EF}$sync signal and the falling edge of the $\overline{WROS}$ signal. The arbitrary flag length empty generator 32 receives inputs of $\overline{WROS}$ at node 35, $\overline{EF}$sync at node 34, and $\overline{RESET}$ at node 36. The arbitrary length empty flag (ARBEF) signal is outputed on node 38 to combinational logic 34.

A wide variety of sequential logic circuits can be utilized as the arbitrary length empty flag generator 32. In the present invention the arbitrary empty flag generator 32 has a first input, $\overline{EF}$sync, coupled to the gates of NMOS transistors 41 and 45, and to inverter 42 which in turn is coupled to the gates of NMOS transistors 43 and 44. Coupled between nodes 37 and 56 are two inverters 46 and 47 and two delay elements 48 and 49. The channel of NMOS transistor 44 is coupled between nodes 56 and 55. The channel of NMOS transistor 45 is coupled between ground and node 55 which is a first input to NAND gate 50. The second input to NAND gate 50 is $\overline{RESET}$. ($\overline{RESET}$ is used to initiate the FIFO after power up. It forces the $\overline{EF}$ signal low.) The output of NAND gate 50 is coupled to one input of NAND gate 51. The second input of NAND gate 51 is coupled to a third input to the arbitrary empty flag generator 32, $\overline{WROS}$. The output of NAND gate 51, node 37, is coupled to the channel of NMOS transistor 43. The other end of the channel of NMOS transistor 43 is coupled to node 60, the input to inverter 52. Node 60 stores the inverse of the present state of the ARBEF signal on line 38. The output of inverter 52 provides a first input to NAND gate 53 while the $\overline{WROS}$ signal provides the second input to NAND gate 53. The output of NAND gate 53 is coupled to inverter 54 and the channel of NMOS transistor 41. The output of inverter 54 is the output of the arbitrary empty flag generator 32, the ARBEF signal.

The function of the arbitrary length empty flag generator 32 is to generate the arbitrary length empty flag (ARBEF) signal on node 38. The ARBEF signal is called an "arbitrary" signal because its active pulse length is dependant upon two asynchronous signals whose timing relationship is completely unknown. The active pulse length of the ARBEF signal can vary from infinitely long to infinitesimally short. The arbitrary length empty flag generator 32 changes the ARBEF signal from low to high when the $\overline{EF}$sync signal transitions from high to low. The arbitrary length flag generator 32 changes the ARBEF signal from high to low when the $\overline{WROS}$ signal transitions from high to low. If the $\overline{EF}$sync transitions from high to low while the $\overline{WROS}$ signal is low, the ARBEF signal remains low. Sequential logic is used in the arbitrary length empty flag generator so that the output, ARBEF signal, can be maintained even after the triggering inputs are removed.

When the $\overline{EF}$sync, $\overline{WROS}$, and $\overline{RESET}$ are each in a steady high state, a low signal is passed through NMOS transistor 45 and appears on node 37 as well node 56. The state of the ARBEF signal on node 38 will be maintained by the feedback through NMOS transistor 41 on node 60 as inverse to node 38.

If the ARBEF signal is high (as well as the $\overline{RESET}$ and $\overline{WROS}$ signal) then when $\overline{EF}$sync goes low it turns off NMOS transistors 41 and 45 and the output of inverter 42 turns on NMOS transistors 43 and 44. Hence, the low on node 37 is passed through NMOS transistor 43 and appears as a high ARBEF signal on node 38. The low on node 37 is also stored via feedback from node 56 to 55 through NMOS transistor 44.

After the above-described event of the ARBEF signal going high due to the $\overline{EF}$sync signal going low, if a low pulse occurs on $\overline{WROS}$, node 37 and node 65 both go high causing the ARBEF signal to go low. This state is stored on node 55 through NMOS transistor 44 if $\overline{EF}$sync is low, or on node 60 through NMOS transistor 41 if $\overline{EF}$sync is, or transitions, high. This state is maintained until the next time $\overline{EF}$sync transitions from high to low. If an $\overline{EF}$sync high to low transition occurs while $\overline{WROS}$ is low, NAND gates 51 and 53 assure that the ARBEF signal stays low by forcing nodes 37 and 65 high.

Minimum pulse generator 33 generates a minimum pulse signal (MIN, active high) having a predefined active pulse length, $T_{min}$, upon receiving a falling edge from the $\overline{EF}$sync signal. The minimum pulse generator 33 is the minimum pulse generator 13 shown in FIG. 5, wherein the $\overline{SET}$ flag signal is the $\overline{EF}$sync signal. The length of the active pulse, $T_{min}$, of the MIN signal is defined by the number of inverters (an odd number) and by the number and sizes of the PMOS and NMOS capacitors found in the inverting delay unit 62. The output of NOR gate 63 is the MIN signal. The falling edge of the minimum pulse signal (MIN) is in essence generated by the rising edge of the minimum pulse signal (MIN).

The combinational logic 34 receives as its inputs the arbitrary length empty flag (ARBEF) from the sequential logic of the arbitrary length empty flag generator 32 and the minimum pulse (MIN) from the minimum pulse generator 33. The combinational logic 34 comprises a "nor" gate 40 which outputs the active low EMPTY flag ($\overline{EF}$) signal.

Figure 8A:
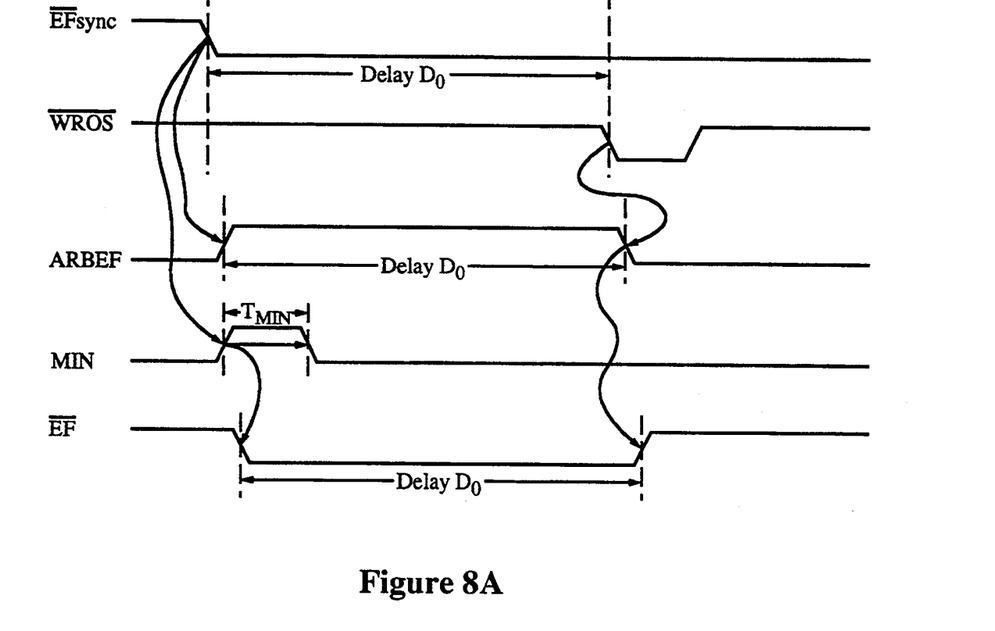
FIGS. 8a-8c are timing diagrams illustrating intermediate signals and flags of the Empty Flag generator of the present invention generated by different timing relationships between the inputs to the present invention.
Figure 8B:
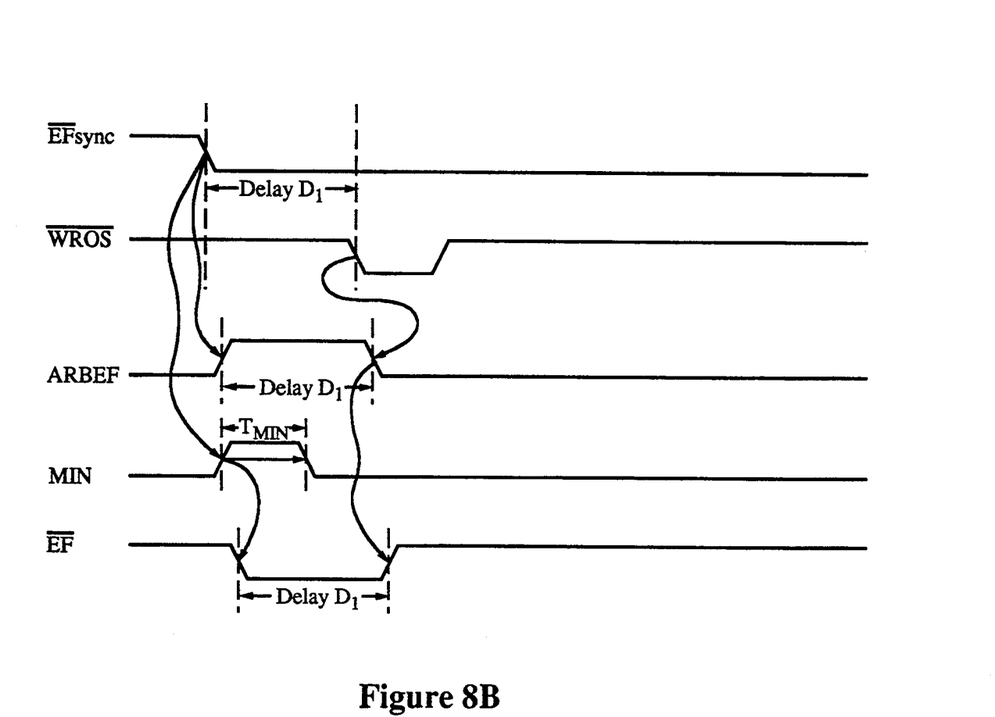

As shown in FIGS. 8a and 8b the combinational logic 34 generates an empty flag signal $\overline{EF}$ having an active pulse length equal to the active pulse length of the ARBEF signal when the active pulse length of the ARBEF signal is longer than the active pulse length, $T_{min}$, of the minimum pulse. When the active pulse length of the ARBEF signal is longer than the active pulse length $T_{min}$ of the minimum signal, the falling edge of the $\overline{EF}$ signal is generated by the rising edge of the MIN signal and the rising edge of the $\overline{EF}$ signal is generated by the falling edge of the ARBEF signal.

Figure 8C:
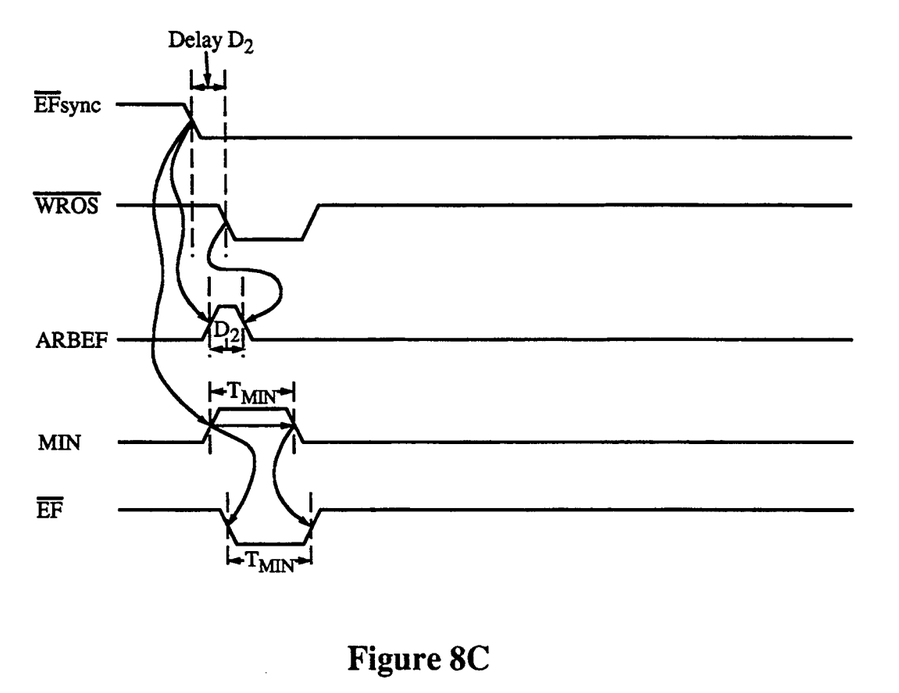

As shown in FIG. 8c the combinational logic 34 generates an empty flag signal ($\overline{EF}$) having an active pulse length equal to the active pulse length, $T_{min}$, of the MIN signal when the active pulse length $T_{min}$ of the MIN signal is longer than the active pulse length of the ARBEF signal. When the active pulse of the MIN signal is longer than the active pulse of the ARBEF signal the EF signal has a falling edge defined by the rising edge of the MIN signal and a rising edge defined by the falling edge of the MIN signal.

In this way, the asynchronous empty flag generator shown in FIG. 7 provides an asynchronous empty flag (EF) signal with a minimum defined pulse length. The asynchronous EMPTY flag signal (EF) can be readily used as data or as a clock to drive external or internal circuitry. The asynchronous empty flag generator 31 of the present invention does not generate "miniscule" pulses and therefore will not place downstream sequential logic circuits into undesirable metastable conditions. Additionally, downstream sequential logic circuits need not provide additional circuitry to filter out potential miniscule pulses. The asynchronous empty flag generator 31 of the present invention is used to drive a register. A register, like all sequential logic, can react properly only if the incoming pulse meets specified requirements. If the register does not receive proper inputs, then the register can malfunction. The asynchronous EMPTY flag generator 31 of the present invention can be used to drive a register without worrying about placing the register into a metastable condition.

Although the present invention has been described with respect to a specific implementation of an internally generated and used EMPTY flag signal (EF), it is to be appreciated that the teachings of the present invention may be utilized to generate a wide variety of status flags. For example, a "FULL flag" indicating when a FIFO is full of data or not full of data can be similarly implemented. Instead of a EFsync signal acting as the set flag, a FF sync signal which indicates the write which fills up the FIFO (derived from a clock write signal (CKW)) would be provided to sequential logic and to a minimum pulse generator. A RROS signal (a one shot derived from a read clock signal (CKR)) would be used as the clear flag signal.

Additionally, a variety of different types of flags can also be generated such as Almost Empty, Half Full, and Almost Full flags (i.e. flags not necessarily on an Empty or Full boundary), error flags, and busy flags. It is also to be appreciated that inverse logic to what has been described may also be used (i.e. active high signals as opposed to active low signals and vice-versa). Additionally, status flags generated from more than two asynchronous signals may also be generated with the present invention. Additionally, the input signals need not necessarily be asynchronous signals to take advantage of aspects of the present invention.

Thus, an asynchronous flag generator has been described for generating an asynchronous status flag having a minimum pulse length so that no "miniscule" pulses are generated which may cause metastable conditions in downstream sequential logic circuits.

I claim:

1. An apparatus for generating a status flag comprising:
    first input means for providing a first signal wherein said signal activates said status flag;
    second input means for providing a second signal wherein said second signal deactivates said status flag;
    circuit means for generating said status flag from said first and second signals wherein said status flag has a predefined minimum active pulse length wherein said circuit means comprises:
    sequential logic means coupled to said first and said second input means for generating an arbitrary length signal which is defined by the time delay between said first and said second signals;
    minimum pulse generating means coupled to said first input means for generating a pulse which has a predefined length upon initiation of said first signal; and
    combinational logic means coupled to said sequential logic means and to said minimum pulse means for generating said status flag with a minimum defined pulse length from said arbitrary length signal and said pulse.

2. An apparatus for generating an asynchronous status flag having a minimum defined pulse length comprising:
    a first input for providing a first signal, wherein said first signal activates said status flag;
    a second input for providing a second signal which deactivates said status flag wherein said second signal is asynchronous with respect to said first signal;
    sequential logic means coupled to said first and said second inputs, said sequential logic means for generating an arbitrary length status flag signal which has an active pulse defined by the time difference between said first signal which activates said flag and said second signal which deactivates said flag;
    minimum pulse generating means coupled to said first input for generating a minimum pulse signal having a predefined length upon initiation of said first signal; and
    combinational logic means coupled to receive said arbitrary length status flag signal and said minimum pulse signal, for generating said asynchronous status flag having:
        i) an active pulse length approximately equal to said predefined length of said minimum pulse signal when said predefined length is longer than said active pulse of said arbitrary length status flag; and
        ii) an active pulse length approximately equal to said active pulse length of said arbitrary length status flag when said active pulse length of said arbitrary length status flag is longer than said predefined length of said minimum pulse.

3. The apparatus of claim 2 wherein said minimum pulse generating means comprises:
    an inverting delay coupled to said first input;
    a nor gate coupled to said inverting delay and to said first input.

4. The apparatus of claim 3 wherein said inverting delay comprises a plurality of inverters and a plurality of delay elements.

5. The apparatus of claim 2 wherein said status flag is an EMPTY flag of a FIFO.

6. The apparatus of claim 5 wherein said first signal is derived from a clock read signal.

7. The apparatus of claim 6 wherein said second signal is derived from a clock write signal.

8. The apparatus of claim 2 wherein said status flag is a FULL flag of a FIFO.

9. The apparatus of claim 8 wherein said first signal is derived from a clock write signal.

10. The apparatus of claim 9 wherein said second signal is derived from a clock read signal.

11. An apparatus for generating an asynchronous EMPTY flag of a FIFO having a minimum defined pulse length comprising:

first input means for inputing a first signal which is derived from a read clock signal of said FIFO, said first signal indicating when said read clock signal reads the last word of said FIFO;

second input means for inputing a second signal wherein said second signal is derived from a write clock signal of said FIFO;

sequential logic means coupled to said first and second inputs for generating an arbitrary length empty flag signal, wherein said arbitrary length empty flag signal has an active pulse length approximately defined by the time delay between said first signal and said second signal;

minimum pulse generating means coupled to said first input for generating a minimum pulse signal having a predefined pulse length upon initiation of said first signal; and combinational logic means coupled to said sequential logic means and to said minimum pulse generating means for generating said asynchronous EMPTY flag from said minimum pulse signal and said arbitrary length empty flag signal, wherein said asynchronous EMPTY flag has an active pulse length approximately defined by:

i) said predefined length of said minimum pulse when said predefined length is longer than said active pulse length of said arbitrary length empty flag; and ii) said active pulse length of said arbitrary length empty flag when said active pulse length of said arbitrary length empty flag is longer than said predefined length of said minimum pulse.

12. An apparatus for generating an asynchronous FULL flag of a FIFO having a minimum defined pulse length comprising:

first input means for inputing a first signal which is derived from a write clock signal of said FIFO, said first signal indicating when said write clock signal writes a word into said FIFO which fills said FIFO;

second input means for inputing a second signal wherein said second signal is derived from a read clock signal of said FIFO;

sequential logic means coupled to said first and second inputs for generating an arbitrary length full flag signal, wherein said arbitrary length full flag signal has an active pulse length defined by the time delay between said first signal and said second signal;

minimum pulse generating means coupled to said first input for generating a minimum pulse signal having a predefined pulse length upon initiation of said first signal; and combinational logic means coupled to said sequential logic means and to said minimum pulse generating means for generating said asynchronous FULL flag from said minimum pulse signal and said arbitrary length full flag signal, wherein said asynchronous FULL flag has an active pulse length approximately defined by:

i) said predefined length of said minimum pulse when said predefined length is longer than said active pulse length of said arbitrary length full flag; and ii) said active pulse length of said arbitrary length full flag when said active pulse length of said arbitrary length full flag is longer than said predefined length of said minimum pulse signal.

13. An apparatus for generating a status flag comprising:

a first input for providing a first signal wherein said signal activates said status flag;

a second input for providing a second signal wherein said second signal deactivates said status flag;

a circuit for generating said status flag from said first and second signals wherein said status flag has a predefined minimum active pulse length, said circuit comprising:

a sequential logic unit coupled to said first and said second input for generating an arbitrary length signal which is defined by the time delay between said first and said second signals;

a minimum pulse generator coupled to said first input for generating a pulse which has a predefined length upon initiation of said first signal; and a combinational logic unit coupled to said sequential logic unit and to said minimum pulse generator for generating said status flag with a minimum defined pulse length from said arbitrary length signal and said pulse.

* * * * *